United States Patent
Berg et al.

(10) Patent No.: US 9,311,434 B1
(45) Date of Patent: Apr. 12, 2016

(54) LADDER LOGIC MODELING AND SIMULATION

(75) Inventors: Joel Berg, Bolton, MA (US); Krishna Tamminana, Westborough, MA (US); Jagadish Gattu, Westborough, MA (US)

(73) Assignee: The MathWorks, Inc., Natick, MA (US)

( * ) Notice: Subject to any disclaimer, the term of this patent is extended or adjusted under 35 U.S.C. 154(b) by 631 days.

(21) Appl. No.: 13/430,089

(22) Filed: Mar. 26, 2012

(51) Int. Cl.
*G06F 7/60* (2006.01)
*G06F 17/10* (2006.01)
*G06F 17/50* (2006.01)
*G06F 9/44* (2006.01)

(52) U.S. Cl.
CPC .............. *G06F 17/5009* (2013.01); *G06F 8/24* (2013.01); *G06F 9/4428* (2013.01)

(58) Field of Classification Search
CPC ...... G06F 17/5009; G06F 8/24; G06F 9/4428
USPC .............................................................. 703/2
See application file for complete search history.

(56) References Cited

U.S. PATENT DOCUMENTS

| | | | | |
|---|---|---|---|---|
| 4,021,783 A * | 5/1977 | Highberger | ...................... | 700/18 |
| 7,203,931 B2 * | 4/2007 | Minamide et al. | ............ | 717/136 |
| 8,127,311 B2 * | 2/2012 | Eryilmaz | ...................... | 719/328 |
| 8,756,039 B2 * | 6/2014 | Coughran et al. | ................ | 703/2 |
| 2005/0275834 A1 * | 12/2005 | Silver | .......................... | 356/237.1 |
| 2010/0082844 A1 * | 4/2010 | Stoupis et al. | .................. | 710/11 |

OTHER PUBLICATIONS

Gomaa, M. (2011). Petri Net to Ladder Logic Diagram Converter and a Batch Process Simulation. Asian Research Publishing Network (ARPN) Journal Engineering and Applied Sciences, vol. 6, pp. 67-72.*
Manesis, S., and K. Akantziotis. "Automated synthesis of ladder automation circuits based on state-diagrams." Advances in Engineering Software 36.4 (2005): 225-233.*
Peng, Shih Sen, and Meng Chu Zhou. "Ladder diagram and Petri-net-based discrete-event control design methods." Systems, Man, and Cybernetics, Part C: Applications and Reviews, IEEE Transactions on 34.4 (2004): 523-531.*

* cited by examiner

*Primary Examiner* — Aniss Chad
(74) *Attorney, Agent, or Firm* — Harrity & Harrity, LLP

(57) ABSTRACT

A computing device may create a time based block diagram. The time based block diagram may comprise a ladder logic diagram and at least one block. The at least one block may correspond to at least one of a differential equation system or a difference equation system. The computing device may also execute the time based block diagram to simulate behavior of a dynamic system, device, or process. Executing the time based block diagram may include executing the ladder logic diagram and the at least one block. The computing device may further output results of the simulation of the behavior of the system, device, or process based on executing the time based block diagram.

36 Claims, 11 Drawing Sheets

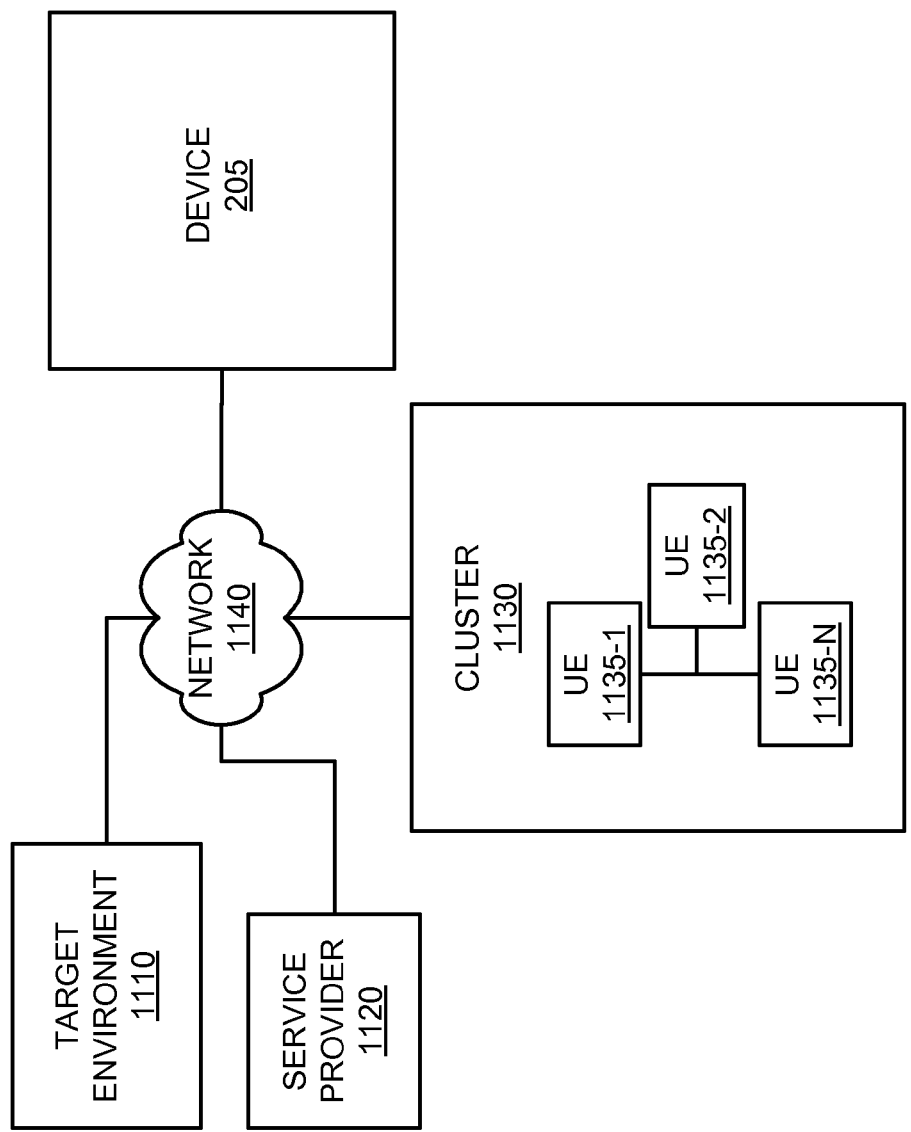

LADDER LOGIC MODELING AND SIMULATION

BRIEF DESCRIPTION OF THE DRAWINGS

FIG. 11 is a diagram of an example distributed environment in which systems and/or methods described herein may be implemented.

DETAILED DESCRIPTION OF PREFERRED EMBODIMENTS

The following detailed description refers to the accompanying drawings. The same labels and/or reference numbers in different drawings may identify the same or similar elements.

A block diagram may represent a system. A computing device may simulate the system by executing the block diagram. However, currently available technologies for simulating systems do not provide adequate solutions for simulating systems based on ladder logic. A computing device may generate code from a block diagram. However, currently available technologies for code generation do not provide adequate solutions for generating code from block diagrams based on ladder logic.

An example implementation, described herein, includes a user device that enables a user to create a model (e.g., a block diagram model) corresponding to a particular system, device, process, etc. The model may include a ladder logic diagram capable of functionally connecting blocks within the model without using connector lines. Based on the model, the user device may be used to create a simulation that operates in a manner consistent with the particular system, device, process, etc. In some examples, the user device may be connected to, or otherwise include, an additional device, which may enhance or help create the simulation. For instance, the user device may be connected to an electronic circuit board and an electronic probe, which the user may interact with to communicate with the user device and engage with the simulation. As described herein, the model may also, or alternatively, be used to generate an executable data structure, an application, or other type of software, hardware, or executable form of the model that may be communicated to another computing device and/or executed by the other computing device to create the simulation or a portion or version thereof.

Figure 1:
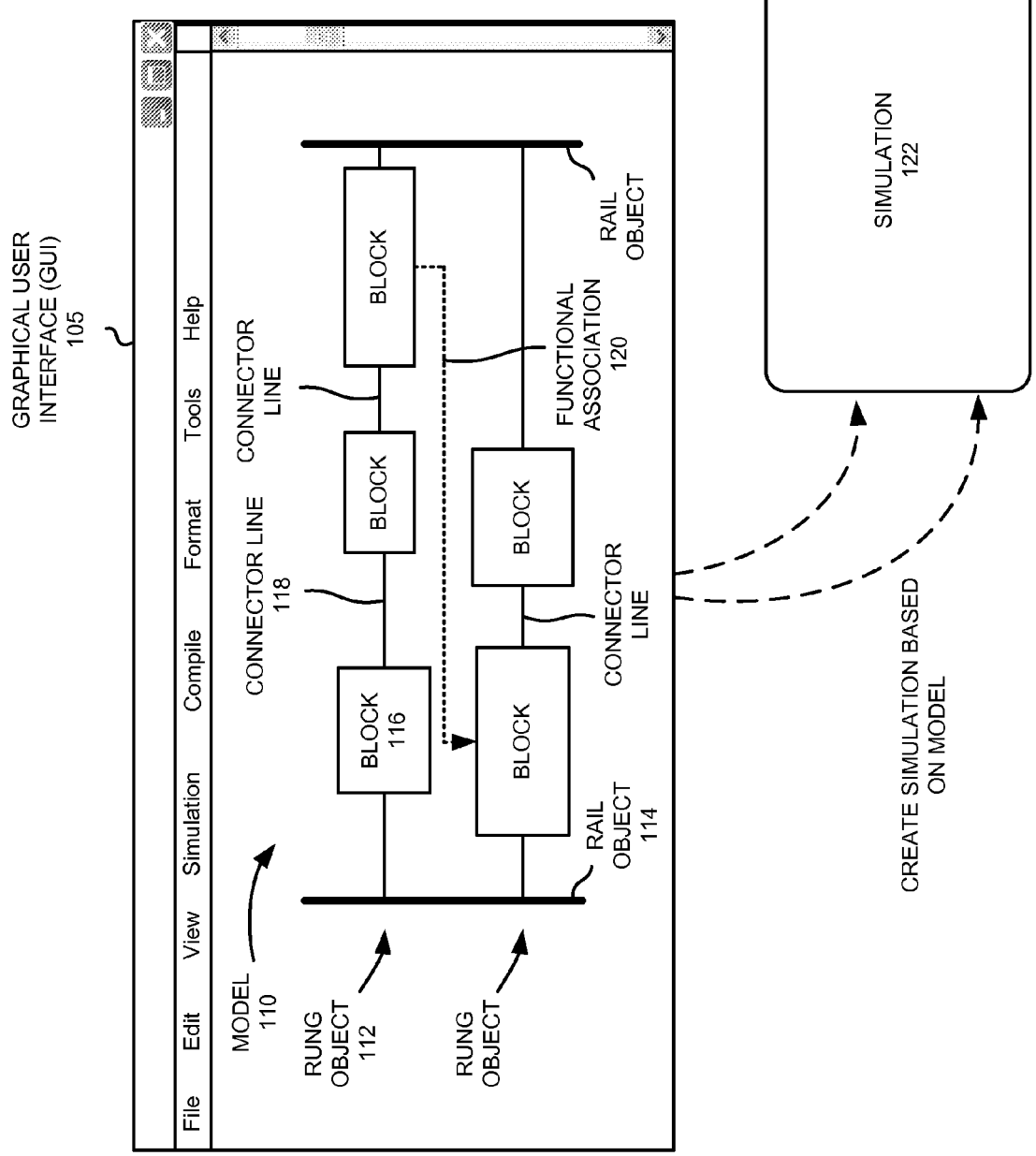
FIG. 1 is a diagram of an example overview of an implementation described herein.

FIG. 1 is a diagram of an example overview of an implementation described herein. The example overview includes a graphical user interface (GUI) 105, a model 110, blocks 116, connector lines 118, and a simulation 122. As depicted, GUI 105 may be provided to enable a user to create model 110. Model 110 may provide a visual representation of a system, a device, a process, a phenomenon, operation, feature, or mechanism corresponding to a discipline or domain (e.g., mathematics, science, engineering, medicine, economics, business, etc.). For instance, model 110 may correspond to an electrical circuit, a hydraulic system, an internal combustion engine, etc. As such, model 110 may include model components, such as a group of blocks 116, that may be connected by connector lines 118. The model components (e.g., blocks 116) may each perform a function depending on the nature of the model component and the model as a whole. The connector lines may represent signal values, energy flow values, power values, etc.

Model 110 may be used to create simulation 122 based on the functionality of blocks 116, connector lines 118, etc. In one example, blocks 116 may represent electrical circuit components (e.g., relays, connectors, switches, etc.) and/or other types of components (e.g., an electrical motor) used in operating an elevator door, and model 110 may be used to create a simulation 122 of the elevator door and/or the electrical circuit components represented by blocks 116. In some implementations, simulation 122 may be created directly within GUI 105 used to create model 110, while in other implementations, model 110 may also, or alternatively, be used to create an executable data structure that may be used to generate the simulation.

As depicted in FIG. 1, model 110 may include a ladder logic diagram that includes rail objects 114 and rung objects 112. In some implementations, rail objects 114 may correspond to different electrical potentials and rung objects 112 may include one or more blocks and/or connector lines. Additionally, or alternatively, one block 116 may be functionally associated 120 with another block 116 so that a signal may pass between the blocks 116 without requiring a particular model component, such as a connector line. In some implementations, a block association map may be maintained to assist a user in determining whether a particular block is functionally associated with another block and/or whether any blocks are available for such an association.

Functionally associating blocks without having to use a connector line or another type of model component may enable a user to create complex models that are not visually confusing or cluttered. Furthermore, providing a block association map that identifies functionally associated blocks and/ or blocks that are available for a functional association may enable models to be created in a more organized and expeditious manner than if an association map were not used.

Figure 2:
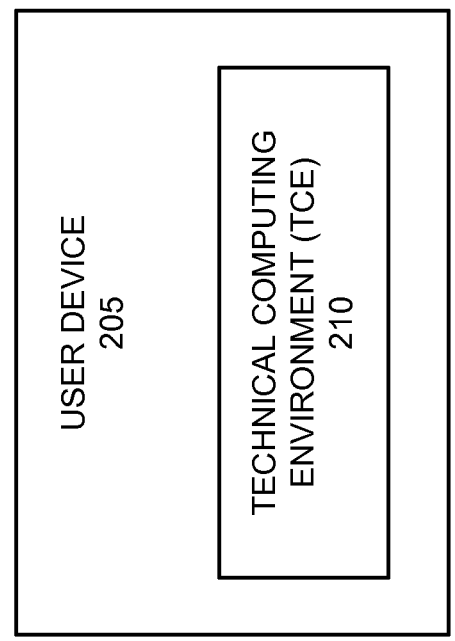
FIG. 2 is a diagram of an example environment in which systems and/or methods, described herein, may be implemented.

FIG. 2 is a diagram of an example environment 200 in which systems and/or methods, described herein, may be implemented. As illustrated, environment 200 may include a user device 205. While FIG. 2 includes particular devices, in alternative implementations, environment 200 may include additional devices, different devices, or differently arranged devices than depicted in FIG. 2.

User device 205 may include a computational device. For example, user device 205 may include a server, a workstation, a mainframe, a computer (e.g., a desktop computer, a laptop computer, a tablet computer, etc.) and/or some other type of computational device.

TCE 210 may include hardware-based logic and/or a combination of hardware and software-based logic that provides a computing environment. The computing environment may permit a user to perform tasks related to a discipline or a domain. For example, the computing environment may pertain to mathematics, science, engineering, medicine, business, and/or another type of discipline or domain.

TCE 210 may include a dynamically typed language (e.g., a dynamically typed programming language) that can be used to express problems and/or solutions in mathematical notations. For example, TCE 210 may use an array as a basic element, where the array may not require dimensioning. In addition, TCE 210 may perform matrix and/or vector formulations that can be used for data analysis, data visualization, application development, modeling, algorithm development, simulation, training, testing, etc. These matrix and/or vector formulations may be used in many areas, such as statistics, finance, image processing, signal processing, control design, life sciences, education, discrete event analysis and/or design, state based analysis and/or design, etc.

TCE 210 may further provide mathematical functions and/or graphical tools (e.g., for creating plots, surfaces, images, models, volumetric representations, etc.). In an implementation, TCE 210 may provide these functions and/or tools using toolboxes (e.g., toolboxes for signal processing, image processing, data plotting, parallel processing, etc.). Additionally, or alternatively, TCE 210 may provide these functions as blocks or block sets. Additionally, or alternatively, TCE 210 may provide these functions in another way, such as via a catalog or a library. For example, in some implementations, an array of blocks and/or other types of model components may be provided in a library (e.g., a model library) that a user may use to identify and/or include blocks in a given model.

TCE 210 may include a user interface for creating, compiling, transforming, executing, analyzing, validating, etc., a model of a system. TCE 210 may provide an environment for modeling the system. For example, TCE 210 may include a graphical-based environment, a textual-based environment, and/or a hybrid environment (e.g., a combination of graphical and textual environments). TCE 210 may include a command line interface to interface with the environment for modeling the system. TCE 210 may connect, access, and/or interface with other software applications, data, devices, and/or other types of resources during a modeling process.

TCE 210 may connect, access, and/or interface with other software applications, data, devices, and/or other types of resources during a modeling process and/or a simulation process. For instance, in some implementations, user device 205 may include, or be in communication with, devices (e.g., an electronic circuit, a particular type of measurement or sensor device, a power source, etc.) that may assist in developing a particular model and/or producing a simulation (also referred to herein as a "simulation environment") corresponding to the particular model. As such, user device 205 and/or TCE 210 may include a wide variety of systems and devices.

Figure 3:
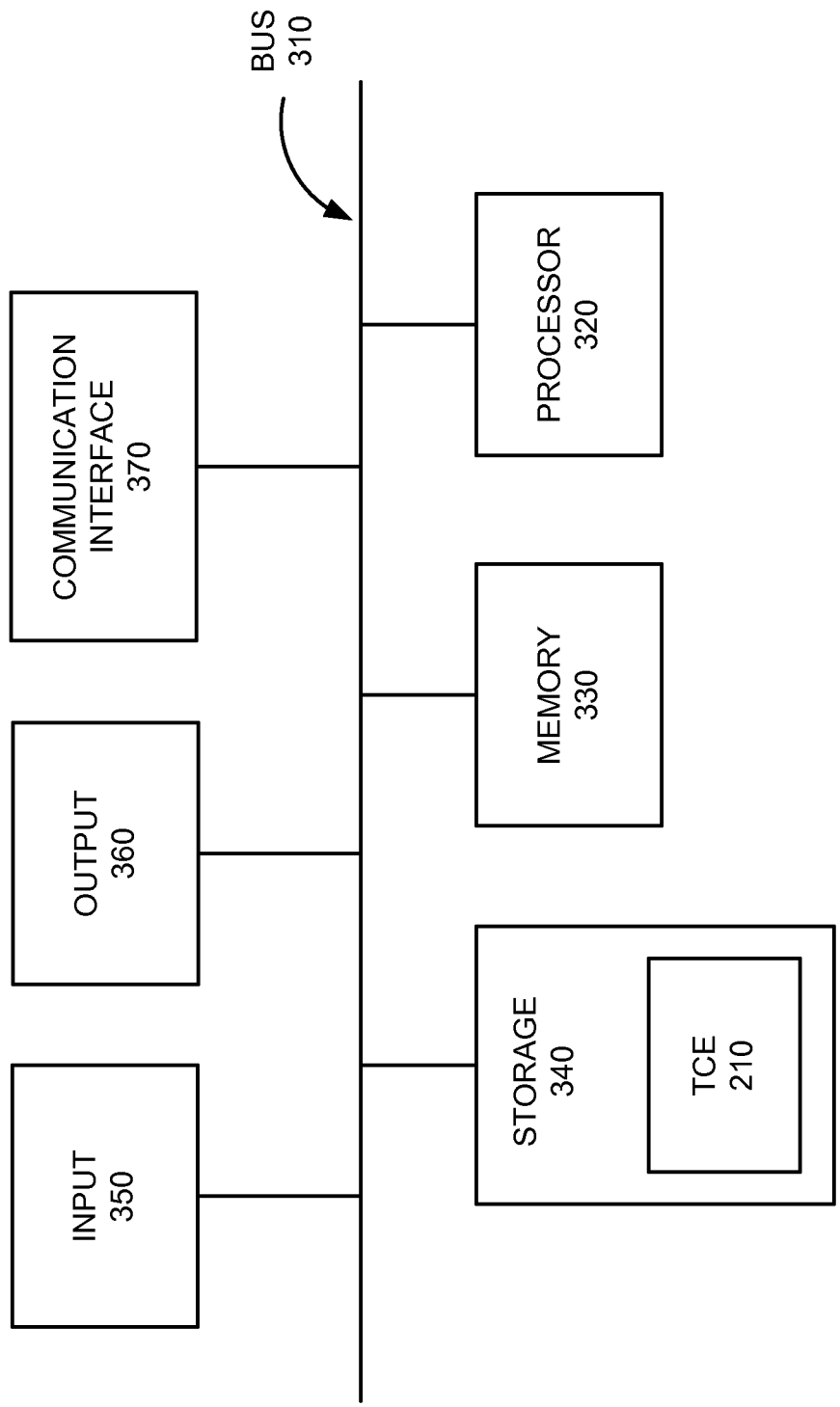
FIG. 3 is a diagram of example components of a user device according to one or more implementations described herein.

FIG. 3 is a diagram of example components of user device 205 according to an implementation described herein. As shown in FIG. 3, user device 205 may include bus 310, processor 320, memory 330, storage 340, input 350, output 360, and/or communication interface 370. In other implementations, user device 205 may include fewer components, additional components, different components, and/or a different arrangement of components than those depicted in FIG. 3. Additionally, or alternatively, a component of user device 205 may perform an act described as being performed by another component of user device 205.

Bus 310 may permit communication among the other components of user device 205. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphical processing unit (GPU), a co-processor, a network processor, an application specific integrated circuit (ASIC), an application specific instruction-set processor (ASIPs), a system-on-chip (SOC), a controller, a programmable logic device (PLD), a chipset, and/or a field programmable gate array (FPGA).

Memory 330 may store data and/or instructions related to the operation and use of user device 205. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of user device 205. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storing device external to and/or removable from user device 205, such as a Universal Serial Bus (USB) memory stick, a hard disk, etc. In an implementation, as illustrated, storage 340 may store TCE 210.

Input 350 may permit the user and/or another device to input information into user device 205. For example, input 350 may include a keyboard, a keypad, a mouse, a display (e.g., a touch screen), a touchpad, a button, a switch, a microphone, voice recognition logic, an input port, and/or some other type of input component. Output 360 may permit user device 205 to output information to the user and/or another device. For example, output 360 may include a display, a speaker, a light emitting diode (LED), a haptic device, a tactile device, an output port, and/or some other type of output component.

Communication interface 370 may permit user device 205 to communicate with other devices, networks, and/or systems. Communication interface 370 may include a transceiver-like component. For example, communication interface 370 may include an Ethernet interface, an optical interface, a coaxial interface, a radio interface, and/or some other type of wireless and/or wired interface.

As will be described in detail below, user device 205 may perform certain operations relating to implementations described herein. User device 205 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Figure 4:
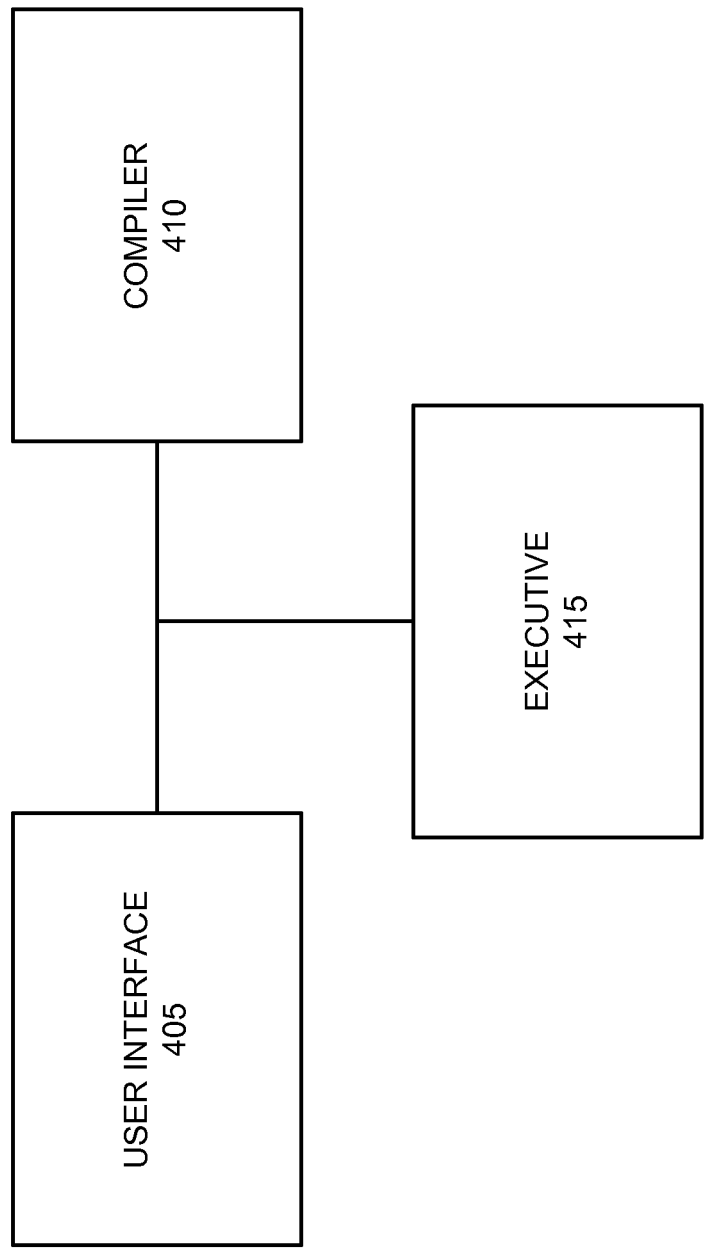
FIG. 4 is a diagram of example functional components of a technical computing environment (TCE) according to one or more implementations described herein.

FIG. 4 is a diagram of example functional components of TCE 210 according to an implementation described herein. TCE 210 may include, for example, a user interface 405, a compiler 410, and an executive 415. In other implementations, TCE 210 may include fewer functional components, additional functional components, different functional components, and/or a different arrangement of functional components than those illustrated in FIG. 4. The functions described in connection with FIG. 4 may be performed by a component of user device 205 depicted in FIG. 3.

User interface 405 may include logic to provide an interface that aids a user in creating, compiling, transforming, executing, and/or analyzing a model of a system. User interface 405 may provide libraries that include predefined entities that may be used to create the model. Additionally, or alternatively, user interface 405 may permit user-defined entities to be created and used when creating the model. For example, user interface 405 may include predefined blocks and/or permit user-defined blocks to be created and used when creating the model of the system.

Compiler 410 may include logic to provide a transformation of information associated with the model to an alternative form. For example, compiler 410 may convert the model into an internal representation that allows the block diagram executive to execute the model represented by the block diagram in an interpreted mode. In particular, compiler 410 may convert the graphical description embodied by the block diagram into an internal form, allocate data structures for the memory, generate an order of execution, and then execute the pre-written versions of the blocks in the block diagram. Compiler 410 may also convert the model into an internal representation which then allows the generation of code which may then be executed in another executable environment.

For example, compiler 410 may generate code (e.g., executable code, target code, intermediate code, etc.) that corresponds to the model. The code may be generated as a textual language (e.g. C/C++) which will then be further compiled and linked into an executable program directly executable by an operating system, including, but not limited to, an operating system on which TCE 210 may be running. For example, compiler 410 may transform the model into generated code in the form of a hardware description language (HDL), which can be used to synthesize custom hardware.

Compiler 410 may perform various operations to generate the code. For example, compiler 410 may prepare data structures, evaluate parameters, configure and propagate component characteristics (e.g., sample time, data type, complexity, dimensions, computational causality, etc.), determine component connectivity, determine signal compatibility, etc., associated with the model. In one implementation, compiler 410 may convert the model into an executable form, which may be executed. In other implementations, compiler 410 may generate an internal representation of the model for execution in an interpreted mode, and/or compiler 410 may generate textual code for further execution in another environment.

The executable form of the model may include, for example, an executable image, object code, a library, and/or some other form. The executable form of the model may also include code generated in a textual language that is not executable directly by the operating system (e.g., of TCE 210), but runs in another environment (e.g., Java, Perl, MATLAB code, or other interpreted languages). The executable form of the model may also include code generated in a byte code that is not executable directly by the operating system (e.g., of TCE 210), but runs in another environment (e.g., Java, Perl, MATLAB code, or other interpreted languages). Compiler 410 may permit the user to select a target platform for the generated executable code. Executive 415 may include logic to execute, run, and/or simulate the executable form of the model and output a result (e.g., a simulation) of the executed model.

In other implementations, TCE 210 may also import and/or access a stored model that was created in another environment, such as, but not limited to, another TCE 210. The imported and/or stored model may then be compiled, executed, etc. For example, the Simulink Coder™ software application by MathWorks, Inc. may generate and execute C and C++ code for models created in the Simulink software application, also by MathWorks, Inc.

Figure 5:
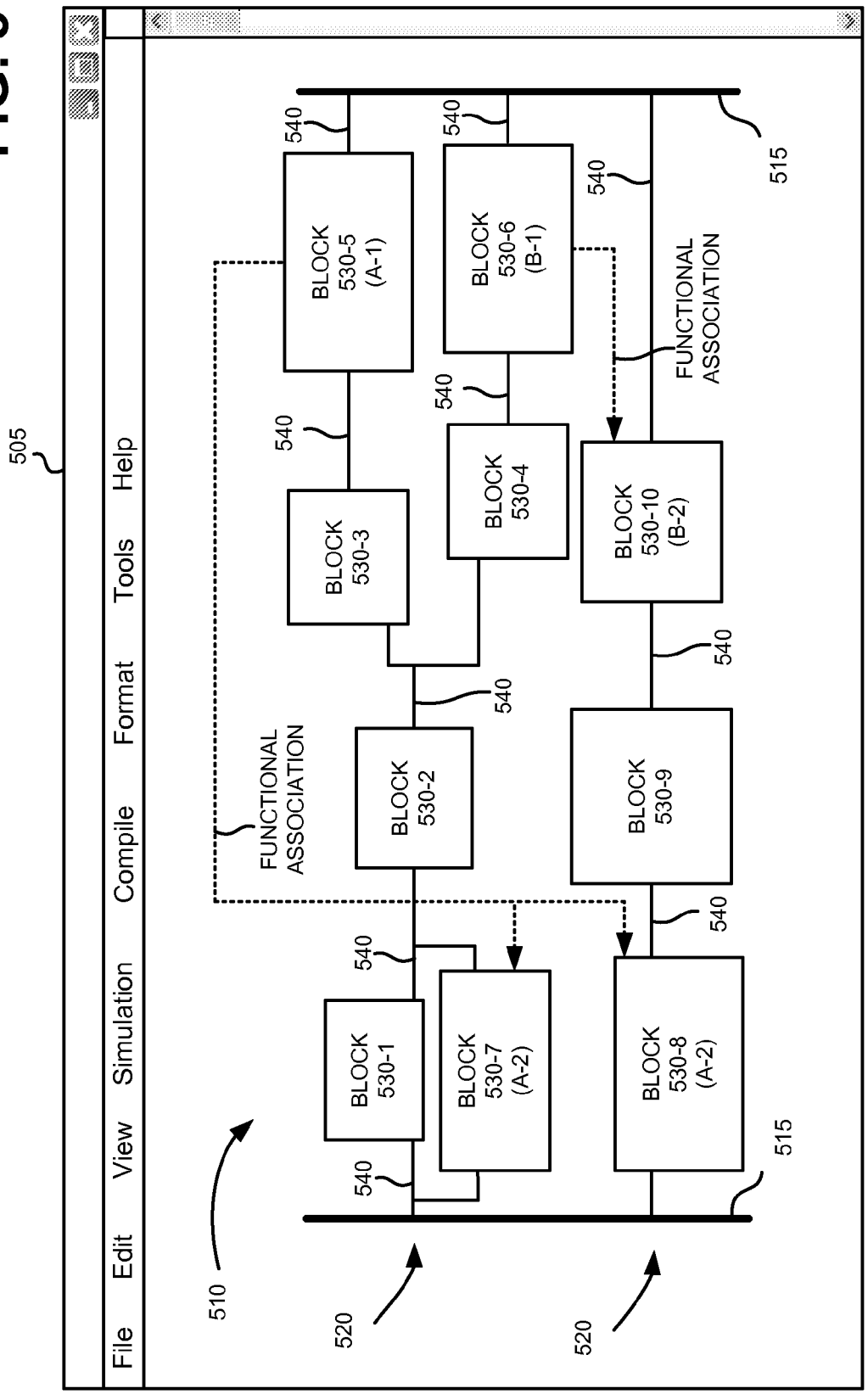
FIG. 5 is an example model in an example graphical user interface (GUI) according to one or more implementations described herein.

FIG. 5 is an example model 510 in an example GUI 505 according to an implementation described herein. User interface 405 may provide GUI 505 in which a user may create model 510. Model 510 may include rail objects 515, rung objects 520, blocks 530-1, 530-2, 530-3, 530-4, 530-5, 530-6, 530-7, 530-8, 530-9, and 530-10 (hereinafter referred to collectively as "blocks 530," and individually as "block 530"). Rail objects 515 and/or blocks 530 may be interconnected via connector lines 540. Also, while functional associations are depicted between certain blocks 530 of FIG. 5, the functional associations are depicted for illustrative purposes and may not actually be visible in an implementation of GUI 505 and/or may be configurable to be visible or not in an implementation of GUI 505.

In the depicted example of FIG. 5, block 530-1 may receive an input signal (e.g., a signal value) that may cause block 530-1 to perform a function, an operation, or another type of action consistent with model 510. Block 530-1 may provide the input signal to block 530-2, which may also perform a function, an operation, or another type of action, in addition to providing the input signal to block 530-3 and/or block 530-4. In turn, block 530-3 and/or block 530-4 may receive the input signal, perform a function consistent with model 510, and provide the input signal to block 530-5 and block 530-6, respectively.

Similarly, block 530-8 may also, or alternatively, receive an input signal that may cause block 530-8 to perform a function, an operation, or another type of action consistent with model 510. Block 530-8 may provide the input signal to block 530-9, which may also perform a function, operation, or another type of action, in addition to providing the input signal to block 530-10. In some implementations, a function, operation, or another type of action performed by blocks 530 may alter the input signal. In some implementations, the functions, operations, or other actions corresponding to a particular block 530 may depend on a sub-component of the particular block 530. For instance, similar to model 510, a particular block 530 may consist of multiple sub-blocks that may be connected by connector lines 540. In addition, each sub-block may perform a function, operation, or another action that contributes to the overall behavior of the particular block 530.

As illustrated, block 530-5 has been functionally associated with block 530-7 and block 530-8. As such, in addition to performing one or more functions consistent with model 510 and providing the input signal to another model component via connector line 540, block 530-5 may provide an input signal to block 530-7 and/or block 530-8. In some implementations, receiving the input signal from block 530-5 may cause block 530-7 and/or block 530-8 to operate in a different manner than block 530-7 and/or block 530-8 might otherwise operate. In other words, since block 530-5 is functionally associated with block 530-7 and block 530-8, block 530-5 may be functionally connected to block 530-7 and block 530-8 without the use of one or more model 510 components, such as connector lines 540.

Additionally, or alternatively, functionally associating two or more blocks 530 may not require that the blocks 530 be arranged in a particular manner or according to a particular alignment. For instance, as depicted in FIG. 5, functionally associating two or more blocks 530 may not require that the blocks 530 be "vertically" aligned with respect to a point or location corresponding to one or more rails 515 (see, e.g., the functional association between block 530-5 and block 530-7). Similarly, as is also depicted in FIG. 5, functionally associating two or more blocks 530 may not require that the blocks 530 correspond to the same rung (see, e.g., the functional association between block 530-5 and block 530-8). Furthermore, functionally associating two or more blocks 530 may not require that the associated blocks 530 be located between the same rail objects 515. As such, in some implementations, two or more blocks 530 may be associated with one another irrespective of position, alignment, or arrangement.

Additionally, or alternatively, blocks 530 may include a visual indication of being functionally associated or connected with one another. For example, block 530-5 may include the symbol "A-1," while block 530-7 and block 530-8 may each include the symbol "A-2." As an example, the letter "A" may indicate that blocks 530-5, block 530-7, and block 530-8 are functionally associated, the number "1" may indicate that block 530-5 communicates a signal value, and the number "2" may indicate the block 530-7 and block 530-8 may receive the signal value. Similarly, block 530-6 and block 530-10 may visually display the symbols "B-1" and "B-2" to indicate a relationship between block 530-6 and block 530-10. In some implementations, this may enable a user to easily understand or otherwise appreciate the functional connection between two or more blocks 530 without requiring a more visually cumbersome model component, such as one or more connector lines 540.

Similarly, since block 530-6 has been functionally associated with block 530-10, block 530-6 may also, or alternatively, provide the input signal to block 530-10. Similar to block 530-7 and block 530-8, receiving the input signal from block 530-6 may cause block 530-10 to operate in a different manner than block 530-10 might otherwise operate. As such, since block 530-6 is functionally associated with block 530-10, block 530-6 may be functionally connected to block 530-10 without the use of connector lines 540. In some implementations, for example, block 530-5 may include a sub-block (e.g., a to-block) that references, or is referenced by, a sub-block (e.g., a from-block) of block 530-7 and/or a sub-block (e.g., a from-block) of block 530-8.

In one example, a block 530 may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally described a directionally consistent signal flow between blocks 530, in other implementations, the interactions between blocks 530 may not necessarily be directionally specific or consistent.

In an embodiment, connector lines 540 in model 510 may represent related variables that are shared between two connected blocks 530. The variables may be related such that their combination may represent power. For example, connector lines 540 may represent voltage, current, power, etc. Additionally, or alternatively, the signal flow between blocks 530 may be automatically derived.

In some implementations, one or more of blocks 530 may also, or alternatively, operate in accordance with one or more rules or policies corresponding to model 510. For instance, if model 510 were intended to behave as an actual, physical system or device, such as an electronic circuit, blocks 530 may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

Model 510 is provided for explanatory purposes only. In practice, model 510 may include more blocks, fewer blocks, different blocks, and/or differently arranged blocks. Similarly, model 510 may include different connections between blocks. Additionally, or alternatively, although model 510 is represented as a block diagram, depending on the environment, model 510 may include a different type of diagram, one or more textual representations, one or more hybrid representations, etc. Furthermore, model 510 may be a time-based model, an event-based model, a state-based model, a data flow-based model, a control flow-based model, etc.

While model 510 includes ladder logic, model 510 may also, or alternatively, include other types of logic. For instance, model 510 may include ladder logic that is embedded into a model that also includes, for example, a network model, a physical model, a plant model, a controller model, a signal processing model, a data acquisition model, a network simulation model, etc. Such a model may also, or alternatively, include attribute propagation capabilities, such as sample times, data types, dimensions, complexity, attributes, etc. Further, the ladder logic and/or code that are generated based on the ladder logic (and/or model 510), may be executed, or otherwise deployed, on different devices.

Graphical models (e.g., model 510) may include entities with relationships between the entities, and the relationships and/or the entities may have attributes associated with them. The entities my include model elements such as blocks 530 and ports. The relationships may include model elements such as lines (e.g., connector lines 540) and references. The attributes may include model elements such as value information and meta information for the model element associated with the attributes. Graphical models may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks (e.g., blocks 530) connected by lines (e.g., connector lines 540). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.). The attributes may consist of meta information such as sample times, dimensions, complexity (whether there is an imaginary component to a value), data type, etc. associated with the model elements.

In a time based block diagram, ports may be associated with blocks (e.g., blocks 530). A relationship between two ports may be created by connecting a line (e.g., a connector line 540) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks (e.g., blocks 530) may be causal and/or non-causal. For example, a model (e.g., model 510) may include a block that represents a continuous-time integration block that may be causally related to a data logging block by using a line (e.g., connector line 540) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

Alternatively, or additionally, a model (e.g., model 510) may include a block (e.g., block 530) that represents a rigid body, another block (e.g., block 530) that represents a rigid body, and a further block (e.g., block 530) that represents a dissipation phenomenon. Each of the rigid body blocks may have a port to represent the velocity of the bodies and the forces acting on the bodies. The dissipation phenomenon block may have a port to represent a velocity and the corresponding dissipation force. Lines (e.g., connector lines 540) may connect each of the three ports, for example, via a common branch point. During execution of the model, the dissipation force may correspond to the difference of the velocities of the two rigid body blocks and the change of velocity of the two rigid body blocks may correspond to the dissipation force.

A sample time may be associated with the elements of a graphical model (e.g., model 510). For example, a graphical model may comprise a block (e.g., block 530) with a continuous sample time such as a continuous-time integration block that may integrate an input value as time of execution progresses. This integration may be specified by a differential equation. During execution the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model (e.g., model 510) may comprise a block (e.g., block 530) with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model (e.g., model 510) may comprise a block (e.g., block 530) with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model (e.g., model 510) may be inferred from other elements of the graphical model or attributes of the graphical model. For example, the graphical model may comprise a block (e.g., block 530), such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model (e.g., model 510) may comprise two unit delay blocks (e.g., blocks 530) where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model (e.g., model 510) may be set to characteristics settings, such as one or more inherited settings, one or more default settings, etc. For example, the data type of a variable that is associated with a block (e.g., block 530) may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Figure 6:
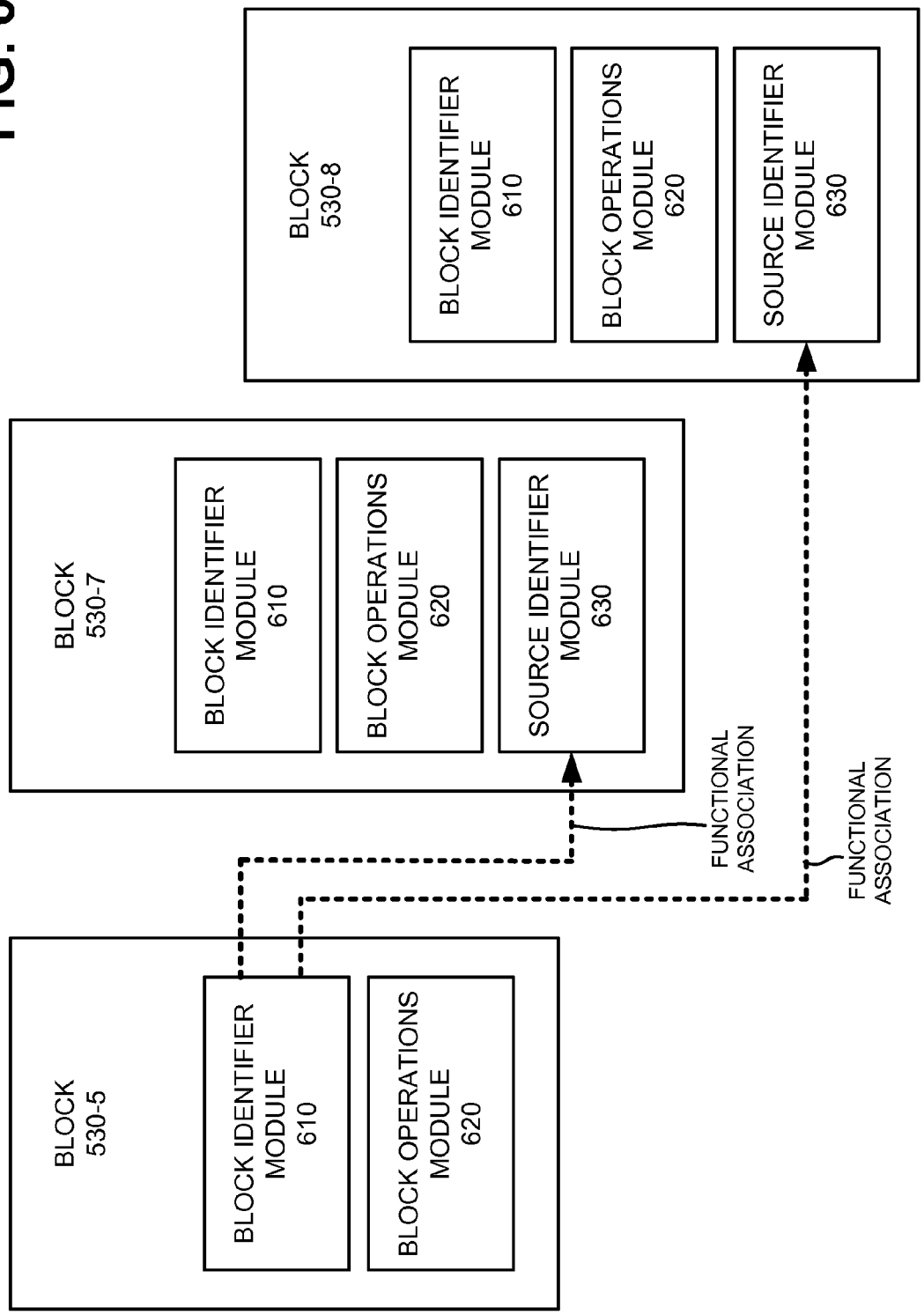
FIG. 6 is a diagram of example functional components of a user device according to one or more implementations described herein.

FIG. 6 is a diagram of example functional components of blocks 530 according to one or more implementations described herein. As depicted, block 530-5, block 530-7, and block 530-8 may include block identifier modules 610 and block operations modules 620. However, block 530-7 and block 530-8 may also include source identifier modules 630. Depending on the implementation, one or more of modules 610-630 may be implemented as a combination of hardware and software based on the components illustrated and described with respect to FIG. 3. Alternatively, modules 610-630 may each be implemented as hardware based on the components illustrated and described with respect to FIG. 3.

Block identifier module 610 may provide functionality with respect to labeling and/or identifying a particular block 530 and/or an element (e.g., a variable, a port, etc.) associated with block 530. For example, since block 530-5 includes block identifier module 610, user device 205 may assign a label or other type of identifier to block 530-5. For similar reasons, user device 205 may also, or alternatively, assign a label or other type of identifier to block 530-7 and block 530-8. Identifiers and/or labels used with blocks 530 may be implemented in machine-readable form and/or human-readable form. In some implementations, block identifier module 610 may provide an interface whereby a user may specify the label or other type of identifier for a particular block 530 and/or element associated with a block 530.

Figure 7:
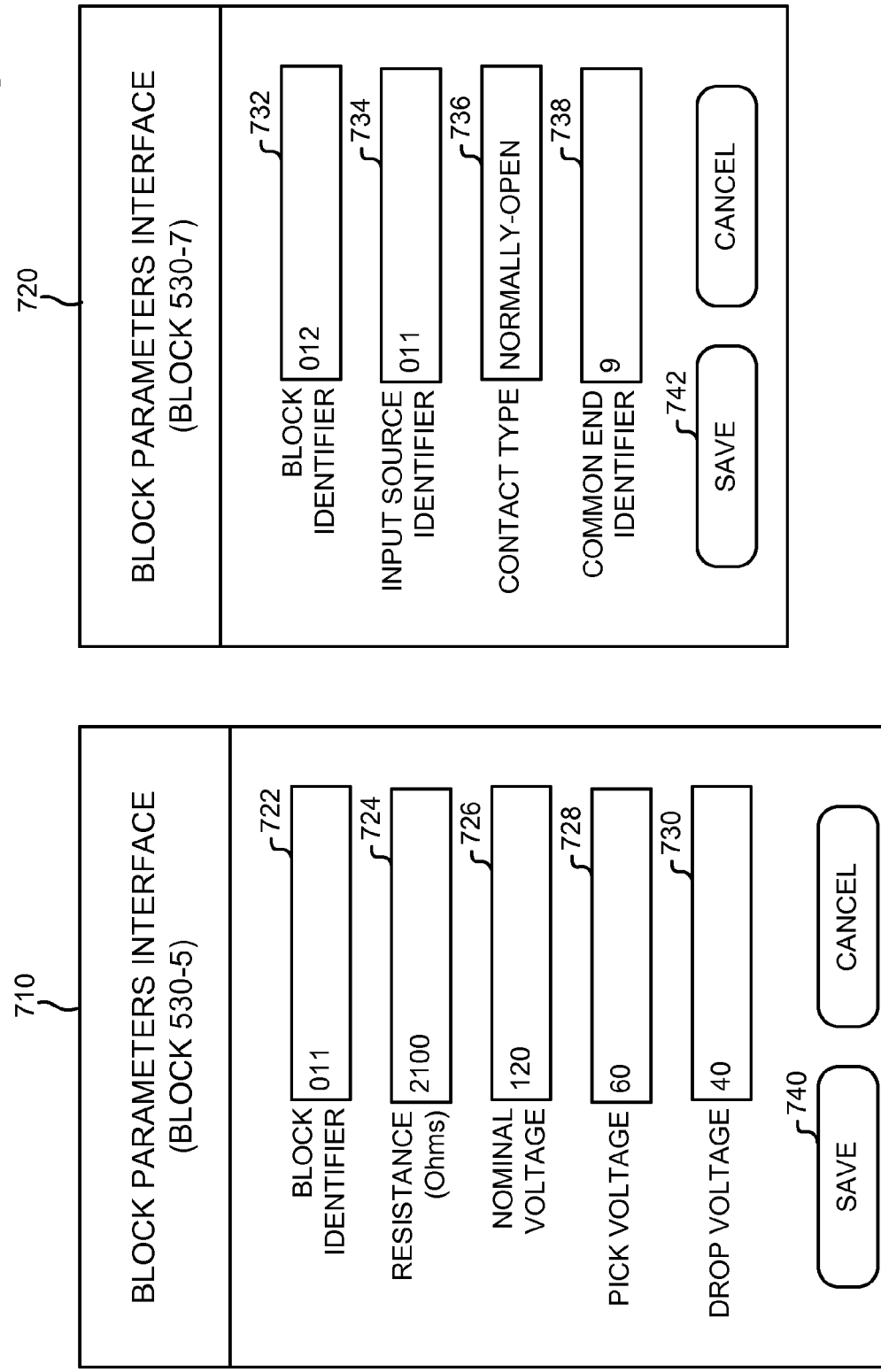
FIG. 7 is a diagram of example block parameters interfaces according to one or more implementations described herein.

For instance, referring now to FIG. 7, block identifier module 610 may be capable of generating a block parameters interface. As depicted in FIG. 7, a block parameters interface 710 corresponding to block 530-5 and a block parameters interface 720 corresponding to block 530-7 may each include a "BLOCK IDENTIFIER" text box (722 and 732). As such, a user (via user device 205) may specify a block identifier by entering numerals, text, or other identification information into "BLOCK IDENTIFIER" text boxes (722 and 732) and selecting "SAVE" buttons (740 and 742).

For instance, the block identifier for block parameters interface 710 corresponding to block 530-5 is "011," and the block identifier for the block parameters interface 720 corresponding to block 530-7 is "012." In some implementations, such an interface may be created by block identifier module 610 when a user (via user device 205) selects (e.g., double clicks on) the corresponding block 530 within model 510. Additionally, or alternatively, a block parameters interface for block 530-8, while not shown in FIG. 7, may be the same as, or similar to, the block parameters interface corresponding to block 530-7.

Returning now to FIG. 6, block operations module 620 may provide functionality with respect to performing one or more functions or operations. For example, operational mode module 630 may enable block 530 to perform one or more functions and/or operations within the context of a particular model 510. In some implementations, the function and/or operation performed by block 530 may be in response to receiving an input signal from one or more input sources (e.g., another block 530).

Source identifier module 630 may provide functionality with respect to specifying a source for receiving an input signal. For example, as discussed above with reference to FIG. 5, a particular block 530 may receive an input signal from another block 530 via connector line 540; however, source identifier module 630 may enable block 530 to receive an input signal from another input source (e.g., another block 530) that may not be connected via one or more connector lines 540. For instance, source identifier module 630 may enable block 530-7 and/or block 530-8 to receive an input signal from block 530-5 by functionally associating (e.g., without using connector lines or other types of visually apparent model components) block 530-5 with block 530-7 and/or block 530-8.

For example, referring again to FIG. 7, block source module 630 may be capable of generating a block parameters interface. In some implementations, block source module 630 may cooperate, or otherwise collaborate, with block identifier module 610, to generate the block parameters interface. As depicted in FIG. 7, block parameters interface 710 corresponding to block 530-7 (which may be similar to a block parameters interface corresponding to block 530-8) may include an "INPUT SOURCE IDENTIFIER" text box 734. As such, a user (via user device 205) may specify an input source identifier by entering numerals, text, or other identification information into an "INPUT SOURCE IDENTIFIER" text box 734 and selecting "SAVE" button 742. For instance, the input source identifier ("011") for block parameters interface 720 corresponding to block 530-7 is the same as the block identifier ("011") corresponding to block 530-5. In this way, a functional association between block 530-5 and block 530-8 may be established.

Additionally, or alternatively, a block parameters interface may include one or more other types of parameters corresponding to a particular block 530 and/or model 510. For example, let us assume that block 530-5 corresponds to an electrical circuit component, such as a relay. As such, block parameters interface 710 corresponding to block 530-5 may include a "RESISTANCE" text box 724, a "NOMINAL VOLTAGE" text box 726, a "PICK VOLTAGE" text box 728, and a "DROP VOLTAGE" text box 730, which may each be specified by a user (via user device 205). These and other types of block parameters may determine, or otherwise affect, one or more of the functions and/or operations that block 530-5 performs within model 510. The block parameters may fall into one or more classes. For example, a first class may include parameters that affect the structural makeup of the model (e.g., parameters that cause contacts to be attached to electrical components, etc.) and thereby affect underlying communication between blocks. Additionally, or alternatively, a second class may include parameters that affect the behavior of the model during simulation (e.g., resistance values and component failure thresholds, etc.). A third class may also, or alternatively, include parameters that affect measurements performed by the model (e.g., sensor selection, units, scaling, etc.).

Similarly, let us assume that block 530-7 corresponds to an electrical circuit component, such as a connector. As such, block parameters interface 720 corresponding to block 530-7 might include a "CONTACT TYPE" text box 736 and a "COMMON END IDENTIFIER" text box 738, which may also, or alternatively, be specified by a user (via user device 205). These and other types of block parameters may determine, or otherwise affect, one or more of the functions and/or operations that block 530-7 performs within model 510. Contact type text box 736 may permit the user to specify, for example, a parameter that identifies the nominal state of the contact for the associated relay (i.e., normally open or normally closed). Common end identifier text box 738 may permit the user to specify, for example, a parameter that identifies a specific common terminal to which the contact is connected. This parameter may be necessary to avoid multiple contacts connected to an identical terminal, which would not make physical sense with off-the-shelf relays.

Figure 8:
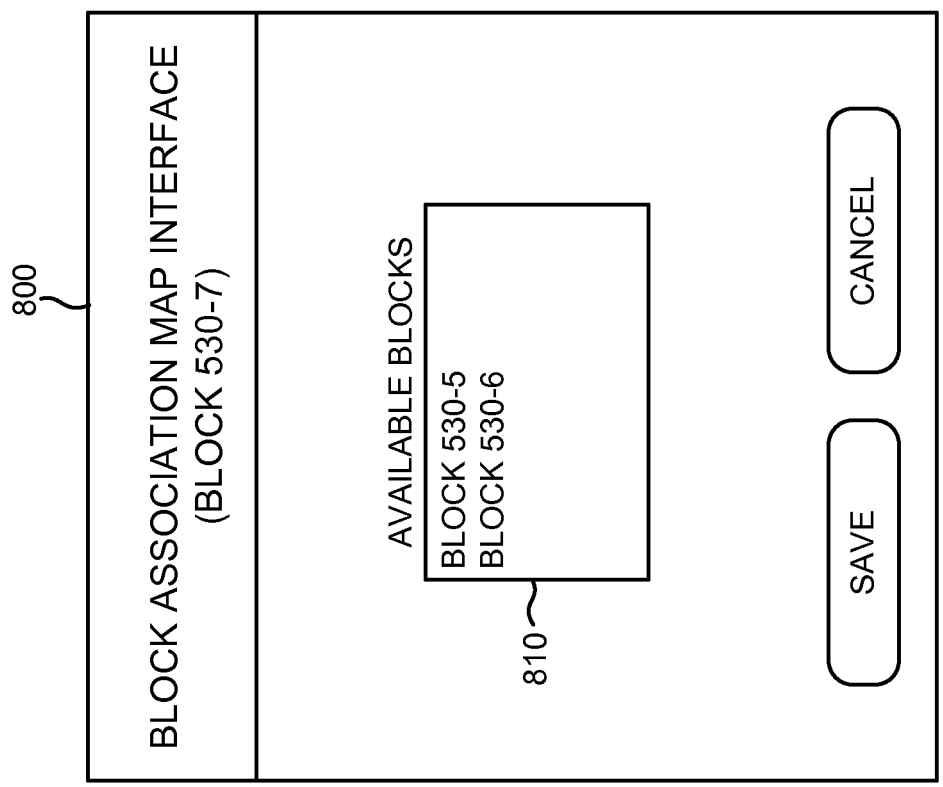
FIG. 8 is a diagram of an example block association map according to one or more implementations described herein.

In some implementations, a block association map may be maintained to facilitate the functional association of one block 530 to another block 530. As mentioned above, the block association map may assist a user in determining whether a particular block 530 is functionally associated with another block 530 or whether a particular block 530 is available for such an association. For example, referring to FIG. 8, upon inserting block 530-7 into model 510 or upon accessing block parameters interface 720 corresponding to block 530-7, a list of available blocks 810 for a functional association (e.g., block 530-5 or block 530-6) may be provided to the user in a block association map interface 800, from which the user may select an available block 530 (e.g., block 530-5 or block 530-6) to create a functional association. Providing this type of functionality may assist the user in creating models, especially in highly complex models. Available blocks for a functional association may be predicated on the parameters exemplified in 710 and 720. For example, contact parameters identified in contact type text box 736 and common end identifier text box 738 may limit the list of available relay blocks to those that include terminals corresponding to the contact type and/or that include a common end identifier that is not occupied.

Referring again to FIG. 6, since block 530-5 includes a block identifier module 610, and block 530-7 and block 530-8 include source identifier modules 630, block 530-5, block 530-7, and block 530-8 may each be configured so that an input signal provided by block 530-5 is sent, or otherwise communicated to, block 530-7 and/or block 530-7. As mentioned above, this may eliminate a need for the corresponding model 510 to include a visible model component (e.g., a connector line) that interconnects block 530-5 with block 530-7 and/or block 530-5 with block 530-8.

Figure 9:
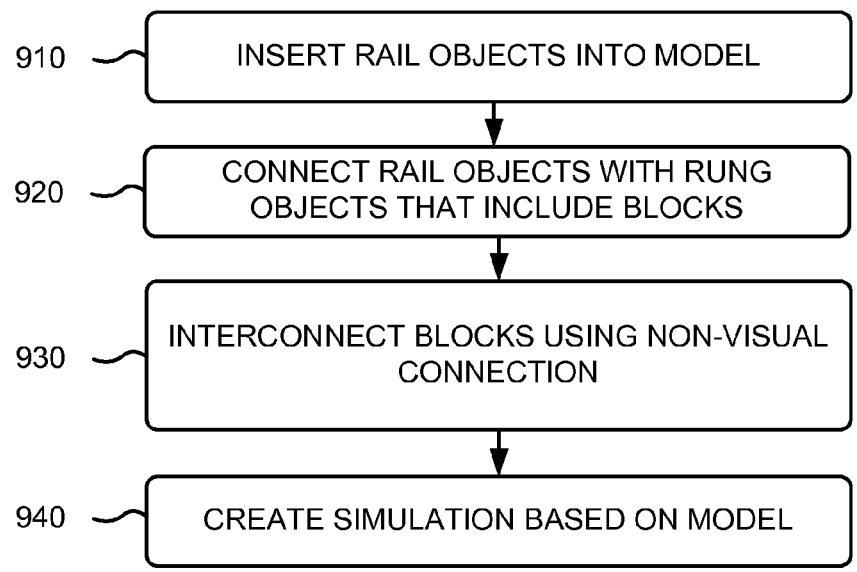
FIG. 9 is a diagram of a process for creating a simulation based on a ladder logic diagram according to one or more implementations described herein.

FIG. 9 is a diagram of a process for creating a simulation based on a ladder logic diagram according to an implementation described herein. In one or more implementations, process 900 may be performed by one or more components of user device 205. In other implementations, one or more blocks of process 900 may be performed by another component/device, or a group of components/devices, including or excluding user device 205.

Rail objects may be inserted into a model (block 910). For example, user device 205 may insert rail objects 515 into model 510. In some implementations, user device 205 may insert rail objects 515 into model 510 in response to one or more inputs from a user. Additionally, or alternatively, user device 205 may insert rail objects 515 from a library, or another type of repository, of model components.

The rail objects may be connected with rung objects that include one or more blocks (block 920). For instance, user device 205 may connect rail objects 515 with rung objects 520 that include blocks 530. In certain implementations, user device 205 may connect rail objects 515 with rung objects 520 in response to one or more inputs from a user. Additionally, or alternatively, user device 205 may connect rail objects 515 using one or more blocks 530, one or more connector lines 540, and/or other types of model components. Similar to the rail objects 515, the model components used by user device 205 to connect rail objects 515 may be obtained from a library, or another type of repository, of model components.

Blocks may be interconnected using a non-visual connection (block 930). For example, user device 205 may functionally connect two or more blocks 530 without using connector lines or other visible model components. In some implementations, user device 205 may functionally connect blocks 530 in response to one or more user inputs. For example, as discussed above, user device 250 may functionally connect blocks 530 by presenting one or more block parameter interfaces to the user and receiving a block identifier, an input source identifier, or other types of identification information from the user.

In some implementations, user device 205 may perform one or more operations to facilitate the functional association of blocks 530. For example, upon the insertion of a particular block 530 that is to receive an input signal from another block 530 via one or more functional associations, user device 205 may scan or survey model 510 for any blocks 530 that are capable and/or available to provide the input signal. For instance, in one example, when user device 205 inserts an electrical component, such as a connector, user device 205 may scan model 510 for complementary electrical components, such as relays, that are available to provide an input signal to the recently inserted connector and generate a list of the available relays from which the user may select to functionally connect with the connector.

A simulation may be created based on the model (block 940). For instance, user device 205 may create a simulation based on model 510. Similar to the operations discussed above, user device 205 may create the simulation in response to inputs from a user. In some implementations, user device 205 may create the simulation within the same GUI 505, user interface 405, and/or TCE 210 as model 510. Additionally, or alternatively, user device 205 may create an executable data structure (e.g., an .EXE file) that may be executed by user device 205 (or by another computing device) to create the simulation. In some implementations, the simulation may also, or alternatively, be generated in a client/server or other type of network environment.

In some implementations, the simulation may be created within technical computing environment 210 (e.g., using the same software application that was used to create model 510). User device 205 may also, or alternatively, create the simulation based on other types of information that may result in, for example, one or more simulation conditions, extraneous simulation effects (e.g., parasitic effects, electromagnetic interference (EMI), radio frequency interference (RFI), electronic noise, etc.), simulation behaviors (e.g., fault scenarios, automated response to un-prescribed faults, fault tree construction, structured text creation, etc.), simulation events (e.g., a fault scenario, root-mean-square (RMS) voltage changes, energy changes, transient energy spikes, etc.), etc. Additionally, or alternatively, user device 205 may create an executable data structure (e.g., an executable software program) that may be executed by user device 205, or another computing or communications device, to create the simulation based on model 510.

Additionally, or alternatively, model 510 may be used for simulation of model 510 at various levels of detail. For example, the simulation may be based on the logic that a ladder logic diagram, of model 510, represents. The simulation may also, or alternatively, be based on the macrophysics that model 510 represents. Similarly, the generated code may also, or alternatively, be based on various levels of detail of model 510 where the code may reflect, for example, the logic and/or the macrophysics that the model represents.

While FIG. 9 shows a flowchart diagram of an example process 900 for creating a simulation based on a ladder logic diagram, in other implementations, a process for creating a simulation based on a ladder logic diagram may include fewer operations, different operations, differently arranged operations, or additional operations than depicted in FIG. 9. For example, model 510 may be created a user may cause user device 205 to create an executable data structure corresponding to model 510 and/or provide the executable data structure to one or more other devices in order to, for example, enable the other devices to create or otherwise produce a simulation associated with model 510. In some implementations, the executable data structure may correspond to one or more programming languages (e.g., Structured Text, C, C++, Sequential Function Charts, Function Blocks, a programming language corresponding to a particular standard (e.g., a programming standard associated with the International Electrotechnical Commission (IEC)), etc.), and/or one or more types of executable applications. In some implementations, the executable data structure may be executed by one or more types of programs, including a multi-domain simulation or model-based design environment, such as Simulink, Simscape, Stateflow, and/or SimEvents, by The MathWorks, Inc. In some implementations, model 510 may be created using one of the foregoing programs.

Figure 10:
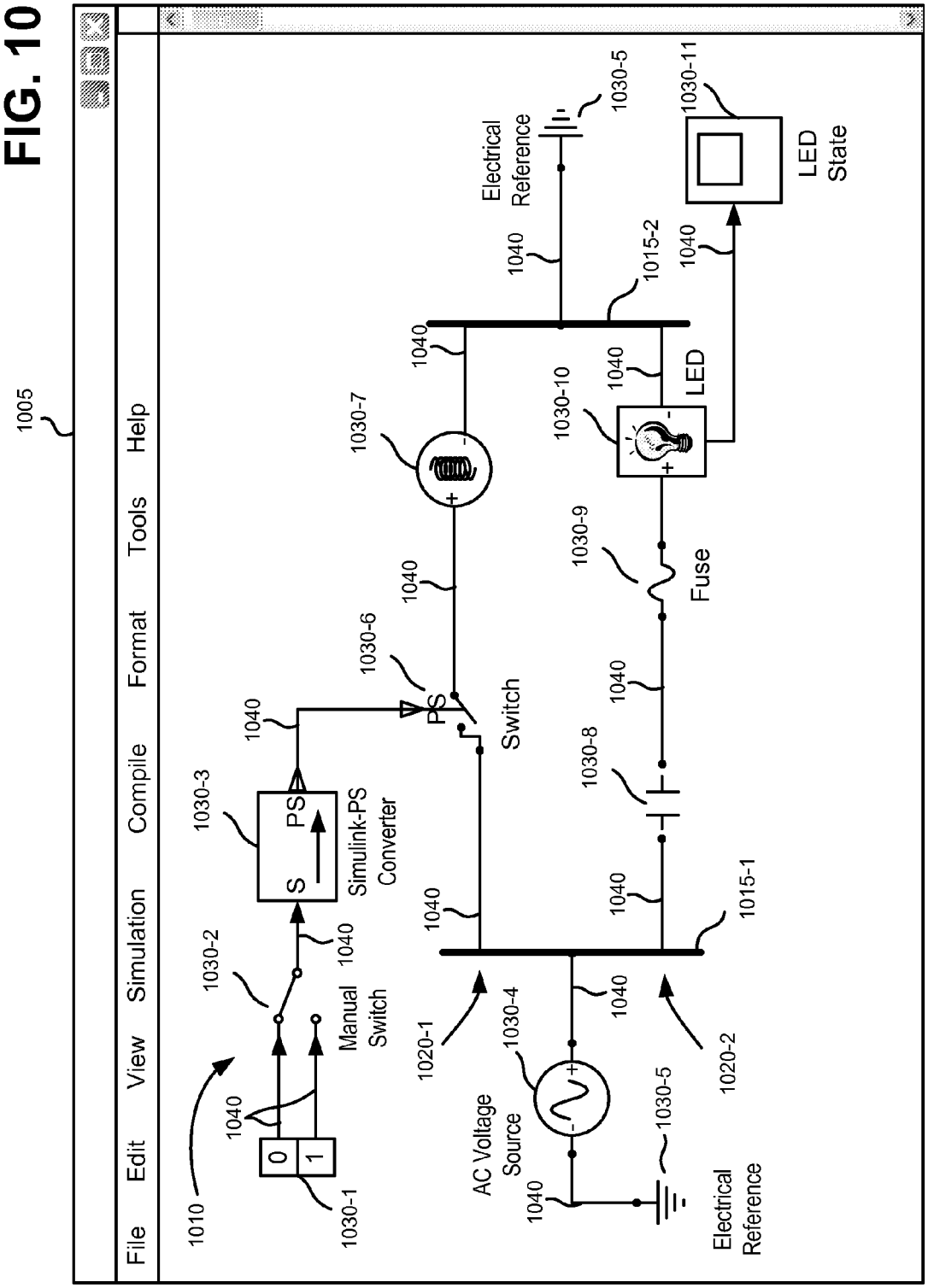
FIG. 10 is an example model in an example graphical user interface (GUI) according to an implementation described herein.

FIG. 10 is an example model 1010 in an example graphical user interface (GUI) 1005 according to an implementation described. User device 205 may perform a simulation based on model 1010. User interface 405 may provide GUI 1005 in which a user may, in a manner similar to that described above with reference to FIG. 9, create model 1010 that represents an electrical circuit. Model 1010 may, in a manner similar to that described above with reference to FIG. 5, include a set of objects, blocks, and/or lines, such as a pair of rail objects 1015-1 and 1015-2, a pair of rung objects 1020-1 and 1020-2, a group of blocks 1030-1, . . . , 1030-11 (hereinafter referred to collectively as "blocks 1030," and individually as "block 1030") and connector lines 1040. Rail objects 1015 and/or blocks 1030 may be interconnected via connector lines 1040.

A first rail object 1015 (e.g., rail object 1015-1) may be associated with a first voltage level, that corresponds to an output voltage of alternating current (AC) voltage source (e.g., represented by block 1030-4). A second rail object 1015 (e.g., rail object 1015-2) may be associated with a second voltage level that corresponds to an electrical ground voltage (e.g., represented by block 1030-5 labeled as "electrical reference 1"). Rail object 1015-1 and rail object 1015-2 may be connect by a first rung object 1020 (e.g., rung object 1020-1) and a second rung object (e.g., rung object 1020-2). Rail object 1015-1 may include block 1030-6, block 1030-7, and connector lines 1040 that interconnect rail object 1015-1, block 1030-6, block 1030-7, and rail object 1015-2. Rail object 1015-2 may include block 1030-8, block 1030-9, block 1030-10, and connector lines 1040 that interconnect rail object 1015-1, block 1030-8, block 1030-9, block 1030-10, and rail object 1015-2.

Block 1030-1 may represent a component that provides one or more input signals (e.g., input values). For example, block 1030-1 may represent a first component that provides a first input signal (e.g., a first signal value of 0 or some other first signal value) and/or a second input signal (e.g., a second signal value of 1 or some other second signal value). Block 1030-2 may represent a component that allows a logical connection to be switched based on input received from a user (e.g., via GUI 1005). For instance, block 1030-2 may correspond to a second component that permits a user, to cause a third component (e.g., represented by block 1030-3) to be connected to the first input signal or the second input signal received from the first component.

Block 1030-3 may represent a component that converts an input signal to an electrical output signal. In one example, block 1030-3 may represent a third component that outputs an electrical signal at a first voltage level when the first input signal is received and may output the electrical signal at a second voltage level when the second input signal is received. Block 1030-4 may correspond to a component that outputs an electrical signal at a voltage level (e.g., a root mean square (rms) voltage (v_rms)) that is predetermined and/or adjustable by the user. Block 1030-4 may, for example, represent a fourth component that includes an AC voltage source that is connected, via rail 1015-1, to one or more components associated with rung object 1020-1 and rung object 1020-2. The fourth component may also, or alternatively, be connected to an electrical reference voltage (e.g., an electrical ground) that is represented by block 1030-5. Block 1030-6 may represent a component that opens or closes an electrical connection based on a received input signal. For instance, block 1030-6 may represent a sixth component that receives, from the third component, an electrical signal, associated with the second voltage level, which may cause the sixth component to establish a connection between the fourth electrical component and a seventh component (e.g., represented by block 1030-7).

Block 1030-7 may represent a component that causes mechanical switching or actuation when an electrical current is received. In one example, the seventh component may include a coil and/or solenoid, associated with a relay, that causes a contact (e.g., represented by block 1030-8), associated with the relay, to mechanically open or close based on a voltage drop across the coil and/or solenoid. Block 1030-7 may, in one example, model the seventh component as a linear inductor with a resistor in series as a differential algebraic equation (e.g., $v=L*(di/dt)+R*i$, where v represents the voltage drop across the coil, L represents inductance of the coil, R represents the in series resistance, i represents current flowing through the coil, and di/dt represents a first derivative of the current with respect to time). Block 1030-8 may represent a component that can be actuated to open or close a connection within an electrical circuit. In one example, block 1030-8 may include a contact, associated with the relay, that is actuated by the coil and/or solenoid associated with the relay. When closed, the contact may allow electrical current to flow between the fourth component and the ninth component (e.g., represented by block 1030-9). When opened, the contact may not allow the electrical current to flow between the fourth component and the ninth component.

Block 1030-9 may represent a component that provides electrical surge protection for an electrical circuit. In one example, block 1030-9 may represent a ninth component that includes a fuse that causes electrical current, to stop flowing between the eighth component and a tenth component (e.g., represented by block 1030-10), when a quantity of current and/or voltage, associated with the electrical current, is greater than a second threshold. Block 1030-10 may represent a component that emits light when an electrical signal is received. In one example, block 1030-10 may represent a tenth component that includes a light emitting diode (LED) or some other light-emitting device that emits light when a voltage drop, across the tenth component, is greater than the first threshold but less than the second threshold (e.g., which may cause the fuse to blow). The LED may also, or alternatively, not emit light when the voltage drop is not greater than the first threshold. Block 1030 may, for example, model the voltage drop as a resistor (e.g., v_lamp=i_lamp*r_lamp, where v_lamp is the voltage drop across the LED, i_lamp is the current through the LED, and r_lamp is resistance associated with the LED).

Block 1030-11 may correspond to an eleventh component that identifies a state, associated with the tenth component, based on a signal received from the tenth component. For example, the eleventh component may display a first value (e.g., 1 or some other first value) that corresponds to a first state when the tenth component is emitting light and may display a second value (e.g., 0 or some other second value) that corresponds to a second state when the tenth component is not emitting light.

In the depicted example of FIG. 10, model 1010 may be associated logic and/or macrophysics that, when executed by TCE 210, simulates operation of the electrical circuit represented by model 1010. Additionally, or alternatively, each block 1030 may be associated with logic and/or macrophysics that allow components of the electrical circuit to be simulated. In one example, some or all of the logic and/or macrophysics, associated with model 1010, may be implemented as one or more mathematical equations in a manner similar to that described above. Additionally, or alternatively, the logic and/or macrophysics, and/or the mathematical equations may be implemented as programming code as provided below:

```
variables
    v      = { 0, 'V' }; % Voltage across relay
    v_coil = { 0, 'V' }; % Voltage through inductor/resistor
    v_lamp = { 0, 'V' }; % Voltage through LED
    i      = { 0, 'A' }; % Current through relay
    i_coil = { 0, 'A' }; % Current through inductor/resistor
    i_lamp = { 0, 'A' }; % Current through LED
end
inputs
    v_rms  = {0, 'V'};              % V rms from AC voltage source
end
outputs
    Lamp   = {0, '1'};              % specifies LED States
end
parameters
    l_coil = { 1e-6, 'H' };         % sets coil inductance value
    r_coil = { 10, 'kOhm' };        % sets coil series resistance value
    lamp_pick_voltage = {72, 'V'};  % specifies LED Voltage for light
                                      emission
    r_lamp = { 1, 'MOhm' };         % LED resistance
end
parameters ( Hidden = true )
    G_leak = { 5000, '1/Ohm' };     % specifies conductance (leakage
                                      to ground)
end
function setup
    through( i, p.i, n.i );
    across( v, p.v, n.v );
end
equations
    v_lamp == i_lamp*r_lamp;        % LED voltage drop modeled by
                                      block 1030-10
    v_coil == i_coil*r_coil +       %voltage drop modeled by
    l_coil*i_coil.der;              block 1030-7
    v == v_lamp;
    v == v_coil;
    i == i_coil + i_lamp;   % current output modeled by block 1030-4
    if v_rms < lamp_pick_voltage
        Lamp == 0;                  % LED does not light when v_rms <
                                      lamp_pick_voltage
    else
        Lamp == 1;                  % LED lights when v_rms ≥
                                      lamp_pick_voltage
    end
  end
end
```

By way of example, TCE 210 may perform a simulation of the electrical circuit by executing model 1010 that represents operation of the electrical circuit. TCE 210 may, in one example, execute the programming code that models behavior and/or performance of each of the components of the electrical circuit. By executing the programming code, TCE 210 may associate variables with various voltages (e.g., v_coil, v_lamp, etc.) and/or currents (e.g., i_coil, i_lamp, etc.) associated with components within the electrical circuit. TCE 210 may also, or alternatively, specify variables to be used for an input signal (e.g., input values, such as v_rms) and/or outputs (e.g., output values, such as lamp) and/or parameters to be used when solving the mathematical equations (e.g., l_coil, r_coil, r_lamp, Gleak, etc.). TCE 210 may also, or alternatively, identify functions and/or solve the mathematical equations based on the variables, the input values, the parameters, and/or may output values as a result of executing the programming code and/or solving the mathematical equations.

Thus, when the coil and/or solenoid, associated with the relay and represented by block 1030-7, receives an electrical signal that causes the voltage drop, across the coil and/or solenoid (e.g., v_coil), the coil and/or solenoid may cause a contact, represented by block 1030-8, to close. Closing the contact may permit an electrical signal to flow to the LED, represented by block 1030-10, via the fuse that is represented by block 1030-9. Provided the fuse is not blown, the LED may emit light if a voltage drop is greater than a first threshold (e.g., represented as lamp_pick_voltage within the programming code) and the programming code may output a first value (e.g., identified as lamp=1 by the programming code). If the voltage drop is not greater than the first threshold, then the LED may not emit light and the programming code may output a second value (e.g., identified as lamp=0 by the programming code).

Additionally, or alternatively, the programming code could be modified to identify a fault scenario associated with the electrical circuit. For example, the programming code could be modified to output a third value to indicate that a fault, within the electrical circuit, has occurred when the contact is closed and the LED is not emitting light. This may indicate that the fuse is blown and/or that a maintenance action is to be performed.

FIG. 11 is a diagram of an example distributed environment 1100 in which systems and/or methods described herein may be implemented. Referring to FIG. 11, environment 1100 may contain various entities including device 205, target environment 1110, service provider 1120, cluster 1130, and network 1140. Note that the distributed environment 1100 is just one example of a distributed environment that may be used with embodiments of the invention. Other distributed environments that may be used with embodiments of the invention may contain more entities, fewer entities, entities in arrangements that differ from the arrangement illustrated in FIG. 11, and so on. Moreover, the distributed environments may be configured to implement various "cloud computing" frameworks.

Details of device 205 were described above with respect to FIG. 2. In distributed environment 1100, device 205 may be configured to, among other things, exchange information (e.g., data) with other entities in environment 1100 (e.g., target environment 1110, service provider 1120, and cluster 1130). Device 205 may interface with the network 1140 via communication interface 370.

Target environment 1110 may be configured to execute and/or interpret a compiled version of a model which may be generated in or otherwise made available to the distributed environment 1100. Network 1140 may include a communication network capable of exchanging information between the entities in network 1140. Network 1140 may include digital and/or analog aspects. The information may include machine-readable information having a format that may be adapted for use, for example, in the network 1140 and/or with one or more entities in network 1140. For example, the information may be encapsulated in one or more packets that may be used to transfer the information through network 1140.

Information may be exchanged between entities using various network protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.10, 802.11, etc.

Network 1140 may comprise various network devices, such as gateways, routers, switches, firewalls, servers, repeaters, address translators, etc. Portions of network 1140 may be wired (e.g., using wired conductors, optical fibers, etc.) and/or wireless (e.g., using free-space optical (FSO), radio frequency (RF), acoustic transmission paths, etc.). Portions of network 1140 may include a substantially open public network, such as the Internet. Portions of network 1140 may include a more restricted network, such as a private corporate network or virtual private network (VPN). It should be noted that implementations of networks and/or devices operating on networks described herein are not limited with regards to, for example, information carried by the networks, protocols used in the networks, and/or the architecture/configuration of the networks.

Service provider 1120 may include logic that makes a service available to another entity in distributed environment 1100. Service provider 1120 may also include a server operated by, for example, an individual, a corporation, an educational institution, a government agency, and so on, that provides one or more services to a destination, such as device 205. The services may include software containing computer-executable instructions that implement one or more embodiments of the invention or portions thereof, and may be executed, in whole or in part, by (1) a destination, (2) service provider 1120 on behalf of the destination, or (3) some combination thereof.

For example, in an embodiment, service provider 1120 may provide one or more subscription-based services that may be available to various customers. The services may be accessed by a customer via network 1140. The customer may access the services using a computer system, such as device 205. The services may include services that implement one or more embodiments of the invention or portions thereof. Service provider 1120 may limit access to certain services based on, e.g., a customer service agreement between the customer and service provider 1120.

The service agreement may allow the customer to access the services that may allow the customer to build, execute, and/or analyze a model for a design, as described above. The service agreement may include other types of arrangements, such as certain fee-based arrangements or restricted access arrangements. For example, a customer may pay a fee which provides the customer unlimited access to a given package of services for a given time period (e.g., per minute, hourly, daily, monthly, yearly, etc.). For services not included in the package, the customer may have to pay an additional fee in order to access the services. Still other arrangements may be resource-usage based. For example, the customer may be assessed a fee based on an amount of computing resources and/or network bandwidth used.

Cluster 1130 may include a number of units of execution (UEs) 1135 that may perform processing of one or more embodiments of the invention or portions thereof on behalf of device 205 and/or another entity, such as service provider 1120. UEs 1135 may reside on a single device or chip or on multiple devices or chips. For example, UEs 1135 may be implemented in a single ASIC or in multiple ASICs. Likewise, UEs 1135 may be implemented in a single computer system or multiple computer systems. Other examples of UEs 1135 may include FPGAs, complex programmable logic devices (CPLDs), ASIPs, processors, multiprocessor systems-on-chip (MPSoCs), graphic processing units, microprocessors, etc. UEs 1135 may be configured to perform operations on behalf of another entity. Service provider 1120 may configure cluster 1130 to provide, for example, the above-described services to computing device 205 on a subscription basis (e.g., via a web service).

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain implementations may involve a component that performs one or more functions. These components may include hardware, such as an ASIC or a FPGA, or a combination of hardware and software.

Even though particular combinations of features are recited in the claims and/or disclosed in the specification, these combinations are not intended to limit disclosure of the possible implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the present application should be construed as critical or essential to the implementations unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

As mentioned above, one or more implementations, described herein, may include a TCE. The TCE may permit a user to, for example, perform tasks related to disciplines, such as, but not limited to, mathematics, science, engineering, medicine, and/or business. The TCE may provide one or more environments for modeling a system. For example, the TCE may include a graphical-based environment, a textual-based environment, and/or a hybrid environment (e.g., a combination of graphical and textual environments). The TCE may connect, access, and/or interface with other software applications, data, devices, and/or other types of resources during a modeling process. Concepts described herein are not dependent upon and/or are limited to a particular type of TCE.

Examples of TCEs that may be modified to incorporate one or more embodiments of the invention include, but are not limited to, the MATLAB®, Simulink®, Stateflow®, Simscape™, and SimEvents®, software applications which are available from The MathWorks, Inc., Natick, Mass.; Unified Modeling Language (UML); profiles associated with UML (e.g., Modeling Analysis and Real-Time Embedded Systems (MARTE), Systems Modeling Language (SysML), Avionics Architecture Description Language (AADL)); GNU Octave from the GNU Project; MATRIXx and LabView® from National Instruments; Mathematica from Wolfram Research, Inc.; Mathcad from Mathsoft Engineering & Education Inc.; Maple from Maplesoft; Extend from Imagine That, Inc.; Scilab and Scicos from The French Institution for Research in Computer Science and Control (INRIA); Modelica and Dymola from Dynasim AB; VisSim from Visual Solutions; SoftWIRE from Measurement Computing Corporation; WiT from DALSA Coreco; VEE Pro and SystemVue from Agilent Technologies, Inc.; Vision Program Manager from PPT Vision, Inc.; Khoros from Khoral Research, Inc.; VisiQuest from Pegasus Imaging Corporation; Gedae from Gedae, Inc.; Virtuoso from Cadence Design Systems, Inc.; Rational Rose, Rhapsody, and Tau from International Business Machines (IBM), Inc.; SCADE from Esterel Technologies; the Eclipse development platform from the Eclipse Foundation; MagicDraw from No Magic, Inc.; CoWare from CoWare, Inc.; and Ptolemy from the University of California at Berkeley.

What is claimed is:

1. A method, comprising:
creating, by a computing device, a time based block diagram, the time based block diagram comprising:
at least one block, the at least one block corresponding to at least one of: a differential equation system or a difference equation system,
another block, and
a ladder logic diagram including the at least one block and the other block;
creating, by the computing device, a functional association between the at least one block and the other block by configuring the other block to include a parameter corresponding to the at least one block,
the functional association being created without using a connector line to connect the at least one block and the other block in the ladder logic diagram;
inferring, by the computing device, a value of a first attribute, associated with the at least one block, based on a value of a second attribute associated with the other block;
executing, by the computing device, the time based block diagram to simulate behavior of a dynamic system, device, or process, the executing including:
executing the ladder logic diagram and the at least one block; and
outputting, by the computing device, results of the simulation of the behavior of the system, device, or process based on executing the time based block diagram.

2. The method of claim 1, where the differential equation system is non-causal, or where the difference equation system is non-causal.

3. The method of claim 2, where the differential equation system or the difference equation system includes an algebraic equation system.

4. The method of claim 1, further comprising:
generating code based on the time based block diagram, the code including one or more equations associated with at least one of:
the differential equation system, or
the difference equation system, and
executing the code to generate results that represent behavior of the dynamic system, device, or process,
the executing the code including solving the one or more equations.

5. The method of claim 4, where the differential equation system or the difference equation system includes an algebraic equation system.

6. The method of claim 4, where generating the code includes:
a sample time, and
generating the code based on the value of the first attribute that is inferred.

7. The method of claim 6, where the first attribute corresponds to a sample time, and
where the sample time includes at least one of:
a continuous time,
a discrete time, or
an asynchronous time.

8. The method of claim 1, where the at least one block comprises a plurality of blocks, the method further comprising:
associating a block, of the plurality of blocks, with a port; and
connecting, via the port, the block with another block associated with the time based block diagram.

9. The method of claim 8, where the block, of the plurality of blocks, comprises a non-causal block, the non-causal block corresponding to a non-causal function, operation, or equation.

10. The method of claim 1, where the inferring is based on a connection between the at least one block and the other block.

11. The method of claim 10, where the inferring is based on propagation.

12. A computing device, comprising:
a processor to:
create a model comprising a ladder logic diagram, when creating the model, the processor is to:
insert a plurality of rail objects into the model, and
connect the plurality of rail objects with at least one rung object,
when connecting the plurality of rail objects with the at least one rung object, the processor is to:
insert at least one block between two or more of the plurality of rail objects, the at least one block being included in the ladder logic diagram and representing a function corresponding to the model, the function being based on a differential equation system or a difference equation system,
create a functional connection between the at least one block and another block included in the ladder logic diagram by configuring the other block to include a parameter corresponding to the at least one block, and
the functional connection being created without connecting the at least one block and the other block with a connector line in the ladder logic diagram,
infer a value of a first attribute, associated with the at least one block, based on a value of a second attribute associated with the other block,
execute the model to simulate behavior of a dynamic system, device, or process, when executing the model, the processor is to:
execute the ladder logic diagram; and
output results of the simulation of the behavior of the system, device, or process based on executing the model.

13. The computing device of claim 12, where, when creating the model, the processor is to:
obtain the model based on one or more user inputs, or
obtain the model from another computing device.

14. The computing device of claim 12, where, when creating the functional connection, the processor is to:
  associate an element corresponding to the at least one block with the other block,
  associate the element with another element corresponding to the other block, or
  associate the at least one block with the other element.

15. The computing device of claim 12, where the at least one block corresponds to a model library comprising one or more types of model components, and
  where the processor is further to:
    receive selection of the at least one block,
    provide the one or more types of model components based on the selection of the at least one block,
    receive selection of a type of model component of the one or more types of model components, and
    associate the at least one block with the selected type of model component.

16. The computing device of claim 12, where, when connecting the plurality of rail objects with the at least one rung object, the processor is to:
  connect at least one connector line to the at least one block, and
  connect the at least one connector line to at least one of the plurality of rail objects.

17. The computing device of claim 12, where, when creating the functional connection, the processor is to:
  provide an interface for selecting an available block with which to create the functional connection,
    the interface being based on a block association map which indicates at least one available block for the functional connection,
    the at least one available block including the available block;
  receive a selection of the available block based on the interface,
    the available block being the other block; and
  associate the at least one block with the other block in the block association map based on the selection, the at least one block and the other block being visually unconnected in the ladder logic diagram.

18. The computing device of claim 12, where the processor is further to:
  generate at least one of:
    code based on macrophysics that the model represents,
    an executable data structure, corresponding to a programming language, based on the model,
    an executable data structure, corresponding to a hardware description language, based on the model, or
    code based on logic represented by the model.

19. The computing device of claim 12, where the processor is further to:
  create an executable data structure based on the model; and
  output the executable data structure to another computing device, the executable data structure enabling the other computing device to execute the data structure to perform the simulation.

20. The computing device of claim 12, where the simulation comprises a simulation environment, the simulation environment being provided by at least one of:
  the computing device,
  another device, or
  a combination of the computing device and one or more other devices.

21. The computing device of claim 12, where the simulation comprises extraneous simulation effects.

22. The computing device of claim 12, where the processor is further to:
  generate code based on the model, and
  execute the code to simulate a fault scenario associated with the model.

23. The computing device of claim 12, where the function, corresponding to the model, is associated with a non-causal modeling operation.

24. The computing device of claim 12, where the non-causal modeling operation operates in accordance with one or more physics-based rules associated with the model.

25. One or more non-transitory computer-readable storage media that stores instructions, the instructions comprising:
  one or more instructions that, when executed by a processor, cause the processor to:
    create a model comprising a ladder logic diagram, the one or more instructions to create the model cause the processor to:
      insert a plurality of rail objects into the model, and
      connect rung objects to the plurality of rail objects, the rung objects including a plurality of blocks,
        each of the plurality of blocks being positioned between the plurality of rail objects,
        each of the plurality of blocks representing a function corresponding to the model,
        at least one block, of the plurality of blocks, being included in the ladder logic diagram and functionally connected to another block included in the ladder logic diagram based on a functional association between the at least one block and the other block,
        the at least one block being functionally connected to the other block while being visually unconnected in the ladder logic diagram when the ladder logic diagram is presented for display,
        the at least one block corresponding to a differential equation system or a difference equation system;
    infer a value of a first attribute, associated with the at least one block, based on a value of a second attribute associated with the other block; and
    execute the model to generate results that represent behavior of the model.

26. The one or more non-transitory computer-readable storage media of claim 25, where the one or more instructions to create the model cause the processor to:
  produce the model based on one or more user inputs; or
  obtain the model from a computing device.

27. The one or more non-transitory computer-readable storage media of claim 25, where the one or more instructions to connect the rung objects to the plurality of rail objects, cause the processor to:
  associate an element corresponding to the at least one block with the other block;
  associate the element with another element corresponding to the other block; or
  associate the at least one block with the other element.

28. The one or more non-transitory computer-readable storage media of claim 25, where the at least one block corresponds to a model library comprising one or more types of model components, and
  where the one or more instructions, when executed by the processor, further cause the processor to:
    receive selection of the at least one block;
    provide the one or more types of model components based on the selection of the at least one block;

receive selection of a model component of the one or more types of model components; and
associate the at least one block with the selected model component.

29. The one or more non-transitory computer-readable storage media of claim 25, where the one or more instructions, to connect the rung objects to the plurality of rail objects, cause the processor to:
connect at least one connector line to the at least one block; and
connect at least one connector line to at least one of the plurality of rail objects.

30. The one or more non-transitory computer-readable storage media of claim 25, where the one or more instructions, to execute the model, cause the processor to:
generate code, that when executed, generates the results that represent behavior of the model.

31. The one or more non-transitory computer-readable storage media of claim 30, where the one or more instructions, to execute the model, further cause the processor to:
generate a simulation; and
output at least one of a first code, a second code, a first executable data structure, or a second executable data structure to a computing device,
the at least one of the first code, the second code, the first executable data structure, or the second executable data structure enabling the computing device to execute the at least one of the first code, the second code, the first executable data structure, or the second executable data structure to perform the simulation.

32. The one or more non-transitory computer-readable storage media of claim 25, where the one or more instructions, to execute the model, further cause the processor to:
generate code based on the model; and
execute the code to simulate a fault scenario associated with the model.

33. The one or more non-transitory computer-readable storage media of claim 25, where the function, corresponding to the model, is associated with a non-causal modeling operation, the non-causal modeling operation operating in accordance with one or more physics-based rules associated with the model.

34. The one or more non-transitory computer-readable storage media of claim 25, where a simulation, generated by executing the model, comprises at least one of:
extraneous simulation effects, the extraneous simulation effects corresponding to at least one of:
a parasitic effect, electromagnetic interference (EMI), radio frequency interference (RFI), or electronic noise;
simulation behaviors, the simulation behaviors corresponding to at least one of: a fault scenario, a response to an un-prescribed fault, fault tree construction, or structured text creation; or
simulation events, the simulation events corresponding to at least one of: a fault scenario, a root-mean-square (RMS) voltage change, an energy level or power level change, or a transient energy spike.

35. The one or more non-transitory computer-readable storage media of claim 25, where the differential equation system is non-causal, or where the difference equation system is non-causal.

36. The one or more non-transitory computer-readable storage media of claim 35, where the differential equation system or the difference equation system includes an algebraic equation system.

* * * * *